United States Patent
Boutchich

(10) Patent No.: US 8,339,842 B2
(45) Date of Patent: Dec. 25, 2012

(54) NON-VOLATILE MEMORY

(75) Inventor: Mohamed Boutchich, Courbevoie (FR)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 353 days.

(21) Appl. No.: 12/824,885

(22) Filed: Jun. 28, 2010

(65) Prior Publication Data

US 2010/0329000 A1    Dec. 30, 2010

(30) Foreign Application Priority Data

Jun. 29, 2009   (EP)   ..................... 09164070

(51) Int. Cl.
G11C 11/00   (2006.01)

(52) U.S. Cl. ........................ 365/158; 365/148

(58) Field of Classification Search ............. 365/48, 365/55, 62, 66, 74, 78, 80–93, 100, 130, 365/131, 148, 158, 171–173, 209, 213, 225.5, 365/230.07, 232, 243.5; 216/22; 257/295, 257/421, 422, 427, E21.665, E27.006; 438/3; 428/810–816, 817–825.1, 826; 977/933–935
See application file for complete search history.

(56) References Cited

U.S. PATENT DOCUMENTS

| | | | |
|---|---|---|---|
| 2002/0153583 A1* | 10/2002 | Frazier et al. | 257/448 |
| 2004/0183382 A1* | 9/2004 | Delamare et al. | 310/12 |
| 2004/0246555 A1 | 12/2004 | Kohl et al. | |
| 2007/0045691 A1* | 3/2007 | Chang et al. | 257/295 |
| 2009/0034325 A1* | 2/2009 | Lowrey et al. | 365/163 |

FOREIGN PATENT DOCUMENTS

| | | |
|---|---|---|
| FR | 2 871 790 | 12/2005 |
| WO | WO 2008 / 104961 A2 | 9/2008 |

OTHER PUBLICATIONS

Search Report with Annex dated Sep. 9, 2009 issued by the European Patent Office in European Application No. 09164070.6, 10 pages.
Kohl et al., "A Novel Actuation Mechanism Based on Ferromagnetic SMA Thin Films,", 12th International Conference on Solid State Sensors, Actuators and Microsystems, Boston, Massachusetts, Jun. 8-12, 2003, pp. 1011-1014.
Wilson et al., "New materials for micro-scale sensors and actuators—An engineering review", Materials Science and Engineering R, vol. 56, pp. 1-129.

* cited by examiner

Primary Examiner — Richard Elms
Assistant Examiner — Harry W Byrne
(74) Attorney, Agent, or Firm — Haynes and Boone, LLP

(57) ABSTRACT

Non-volatile memories can have data retention problems at high temperatures reducing the reliability of such devices. A non-volatile memory cell is described having a magnet, a ferromagnetic switching element and heating means. The non-volatile memory cell has a set position having a low resistance state and a reset position having a high resistance state. The non-volatile memory is set by applying a magnetic field to the switching element causing it to move to the set position. The non-volatile memory cell is reset by the heating means which causes the switching element to return to the reset position. The switching element is formed from a ferromagnetic material or a ferromagnetic shape memory alloy. This structure can have improved reliability at higher temperatures than previously described non-volatile memories.

16 Claims, 5 Drawing Sheets

NON-VOLATILE MEMORY

This application claims the priority under 35 U.S.C. §119 of European application number 09164070.6 filed Jun. 29, 2009, the disclosure of which is incorporated herein by reference in its entirety for all purposes.

TECHNICAL FIELD

This invention relates to non-volatile memories.

BACKGROUND

A non-volatile memory is a computer memory device which can retain the data stored even when no power is applied. Examples of non-volatile memories widely used today are read only memories, flash memories, and optical and magnetic disc drives.

Flash memories are widely used in memory cards and USB drives to store data and to transfer data between a computer and other digital devices such as cameras and mobile phones. Flash memories are implemented using floating gate transistors, which generally comprise a MOS transistor capacitively coupled to a number of secondary gates.

Because the floating gate is electrically isolated from the secondary gates, any charge trapped on the floating gate is retained for a long period of time without a power supply being required. By applying voltages to the source, drain and secondary gates, the charge stored on the floating gate can be altered. The charge trapping region in the floating gate can be fabricated using a number of different materials, for example polysilicon, silicon nitride or a nanocrystal charge trap structure.

A problem with this technology is a lack of high temperature data retention. In the latest devices, at high temperatures, electrons stored either in poly-silicon floating gate, nanocrystal or silicon nitride trapping layer are thermally exited and easily escape from the storage medium. As a result, data retention is severely compromised and so such devices do not operate reliably.

An alternative implementation of a non-volatile memory uses micro electromechanical system (MEMS) technology.

US 2007/0086237 describes a non-volatile memory using a shape memory alloy which returns to a predetermined shape when heated above a certain temperature, referred to as the Martensite transition temperature. The shape memory alloy is used to implement a transistor a gate for a field effect transistor or a mechanical switch. The shape memory alloy is actuable to different positions by applying an electrostatic field or heat, and dependent on the position, the memory stores either a logic 1 or logic 0.

US 2008/0144364 describes an electromechanical memory device with a cantilever electrode formed from a shape memory alloy arranged between two word lines. Applying an electrostatic force causes the cantilever electrodes to deform sufficiently to contact the word lines. Once the cantilever electrode is in contact with the word lines, contact can be continuously maintained by Van der Waals's force of attraction between electrode and the word line. The cantilever electrode is released by passing a current through the electrode causing the shape memory alloy to heat above the Martensite transition temperature and to return to its original shape, breaking the contact between the electrode and the word line.

WO 94/27308 describes a bistable memory element with a base contact and a bridging contact. The bridging contact is deflected to be in contact with the base contact by applying an electrostatic force in one direction and deflected away from the base contact by applying an electrostatic force in the opposite direction.

SUMMARY

According to a first aspect, there is provided a non-volatile memory cell comprising a switching member moveable between a set position and a reset position, a magnet for applying a magnetic field to move the switching member to the set position, heating means for applying heat, to return the switching member to the reset position.

The magnet can be used to move the switching member to the set position, due to the magnetic attraction between the switching member and the magnet. The magnetic attraction between the switching member and the magnet can be removed by heating the switching member above the Curie temperature. The switching member can return to the reset position when the magnetic field is removed. Since the Curie temperature is fixed for a given material, the material for the switching member can be selected such that the non-volatile memory cell is substantially insensitive to temperature variations in its designed operating environment.

In some embodiments, a contact is provided for retaining the switching member in the set position. The Van der Waal's force of attraction between the contact and the switching member can retain the switching member in the set position.

In further embodiments, the contact can be magnetic. In such embodiments, the switching member can be retained in the set position by the magnetic force of attraction between the contact, and the switching member. The magnetic attraction between the switching member and the magnetic contact can be removed by heating the magnetic contact above the Curie temperature. The switching member can return to the reset position when the magnetic field is removed.

The switching member may comprise a ferromagnetic mechanical flexure. In such embodiments, the central portion of the mechanical flexure can be attracted towards the magnet in the set operation. In further embodiments, the mechanical flexure can be retained by a magnetic contact in the set position.

In one embodiment, the switching member comprises a shape memory alloy. In such an embodiment, when the switching member is heated above the Martensite transformation temperature, the shape memory alloy deforms and the switching member returns to the reset position. Furthermore, the Martensite transformation temperature can be tuned according to the composition of the alloy to improve the immunity of the non-volatile memory cell to temperature variations.

The switching member can comprise a spiral. The spiral shape can allow the switching member to be moveable perpendicular with respect to the magnet, which can result in a more compact arrangement of the non-volatile memory cell. Furthermore, the spiral shape can have an elastic or spring restoring force. This may result in a fast transition between the set position and reset position when the switching member is heated to a temperature above either the Martensite transition temperature or the Curie temperature.

The heating means can comprise a current source operable to pass a current through the switching member. When a current is passed through the switching member, the resistance of the circuit including the switching member can cause the temperature of the switching member to rise above either the Martensite or Curie temperature during the reset operation. The heating resistor can be part of the switching member or a separate element.

BRIEF DESCRIPTION OF THE DRAWINGS

Some embodiments will be described hereinafter, by way of example only, with reference to the accompanying drawing in which like reference signs relate to like elements and in which.

DETAILED DESCRIPTION

Disclosed embodiments provide a non-volatile memory cell having improved reliability and provides an apparatus for mitigating the high temperature effects on the reliability of non-volatile memories. A number of elements are formed on a silicon substrate using standard integrated circuit deposition techniques such as evaporation and sputtering. A magnet can be formed from a ferromagnetic material such as Nickel or it can be an electromagnet. A contact can be formed from a metal such as Cu, Al or a ferromagnetic material such as Nickel.

A switching element is typically formed from a ferromagnetic material such as Nickel or a shape memory alloy such as NiMnGa, TiNi, or TiNiCu, CuZnAl, hereinafter referred to as SMA. A ferromagnetic material loses its properties above a critical temperature known as the Curie temperature which for Nickel for example, is 631 degrees Kelvin.

Figure 1:
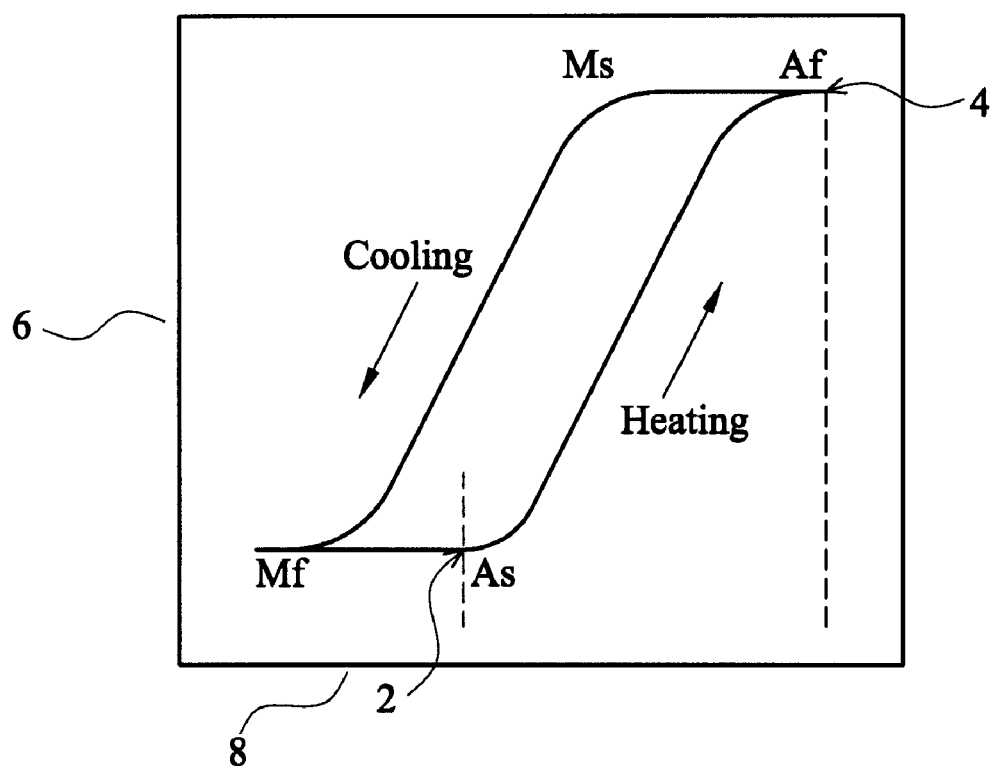
FIG. 1 shows the shape memory alloy phase transformation temperature.
Figure 2:
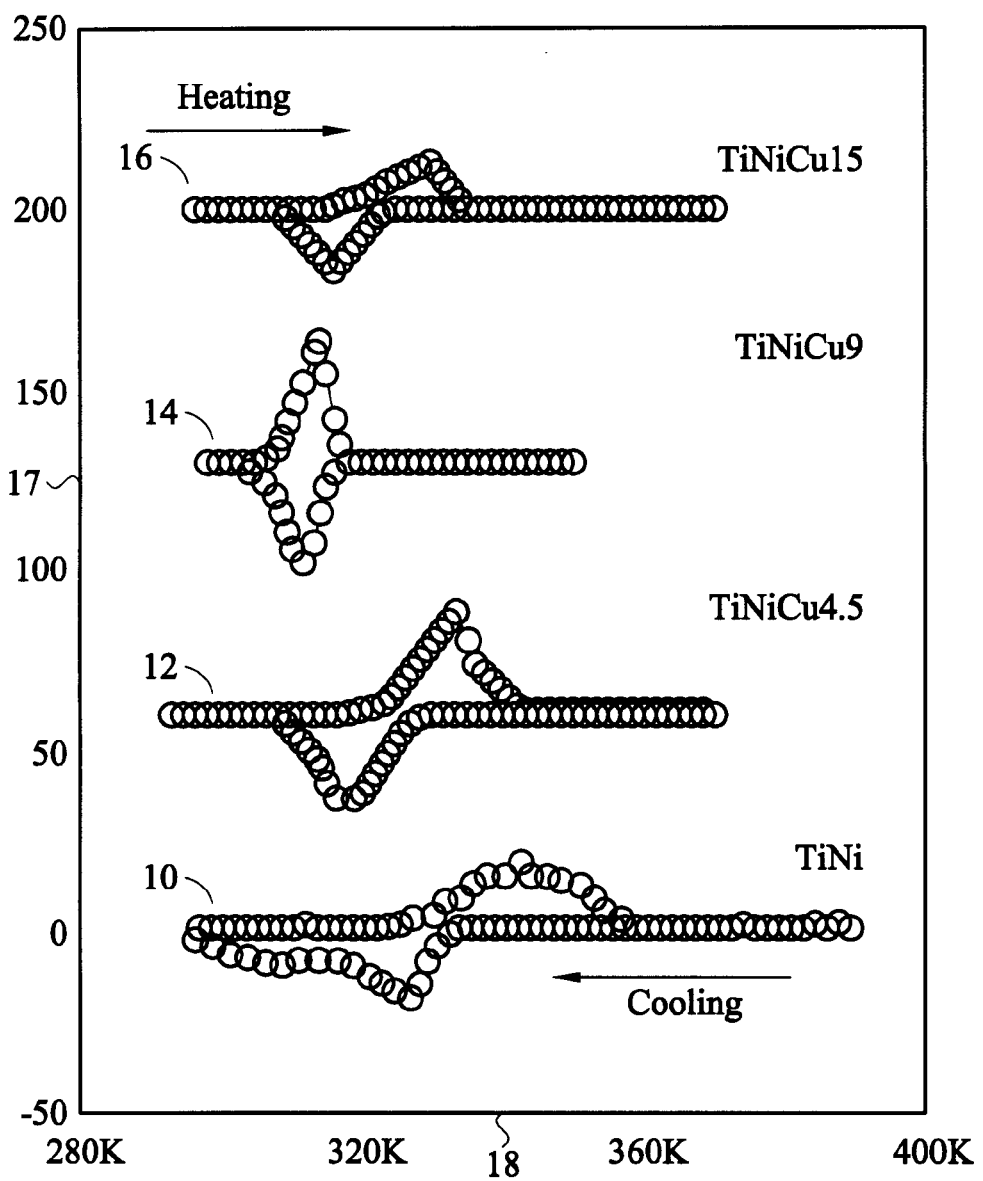
FIG. 2 shows the Martensite transformation temperature of TiNi shape memory alloy with varying Cu content.

A SMA crystal structure will change between Austenite and Martensite crystal phases, dependent on temperature according to the heating and cooling cycle shown in FIG. 1. The heating cycle of FIG. 1 shows the percentage of the material in the Austenite crystal phase 6 versus the temperature 8. At lower temperatures, the SMA structure is Martensite which is easily deformed. As the SMA material is heated beyond a first temperature 2, the composition changes between Martensite and Austenite until at temperatures above the Martensite transformation temperature 4, the shape memory alloy is completely Austenite and the alloy recovers its initial shape. The temperature at which the phase transformation occurs can be varied by altering the relative composition of the alloy as illustrated in FIG. 2 illustrates a graph of the stress increase rate per degrees Kelvin 17 versus temperature 18. This shows the temperature of the phase transformations in the range of 300 to 350 Kelvin dependent on whether the alloy is TiNi 10, TiNiCu4.5 12, TiNiCu9 14 or TiNiCu 15 16.

Example embodiments are described in further detail in the following sections. As described below, disclosed techniques can be applied to fabricate a non-volatile memory cell on a silicon substrate. Detection of the logic state is typically achieved by detecting the change of the resistance of the memory cell.

Figure 3A:
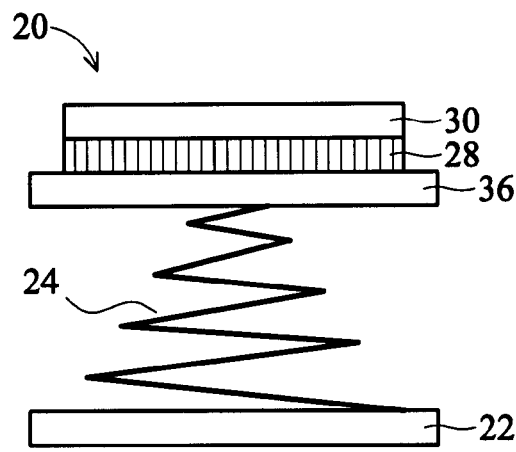
FIG. 3A illustrates a non-volatile memory cell structure comprising a spiral switching member in the set position in accordance with an embodiment.
Figure 3B:
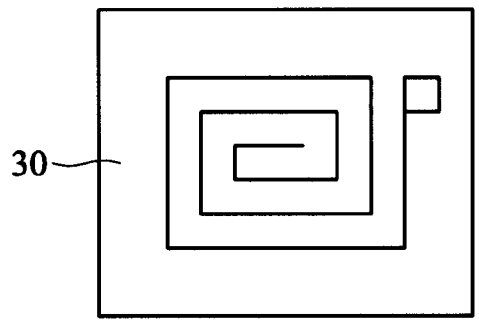
FIG. 3B illustrates the electromagnet structure of the embodiment of FIG. 3A.

FIG. 3A illustrates an example embodiment. In the non-volatile memory cell 20, an electrode 22 is formed on a silicon substrate; a spiral-shaped switching member 24 is formed from a ferromagnetic shape memory alloy which is electrically connected to the electrode 22. As formed the spiral shaped switching member 24 is in the reset position. In this example embodiment, a second electrode 26 is formed in a layer above the switching member 24 using conventional evaporation and sputtering techniques. The gap between the second electrode 26 and the electrode 22 can be, for example, either air or an inert atmosphere. An inert atmosphere can improve the switching speed and reduce convection losses. An electromagnet 30 is formed above the electrode separated by an insulating layer 28 using conventional evaporation and sputtering techniques. FIG. 3B shows a plan view of an example embodiment of an electromagnet 30, formed by a spiral of metal such as copper or aluminium.

The non-volatile memory cell is set by applying power to the electromagnet 30. The magnetic attraction between the electromagnet 30 and the spiral-shaped switching member 24 causes the spiral-shaped switching member to move towards the electromagnet 30. Once the spiral-shaped switching member 24 is in contact with the second electrode 26, the magnetic field can be removed, by removing power from the electromagnet 30. Electrical contact between the spiral-shaped switching member 24 and the second electrode 26 is maintained by Van der Waal's force. The switch connects the electrode 22 and second electrode 26 and hence in the set position, the non volatile memory cell 10 is in a low resistance state. No electrical power needs to be applied to hold the spiral-shaped switching member 24 in the set position.

Figure 3C:
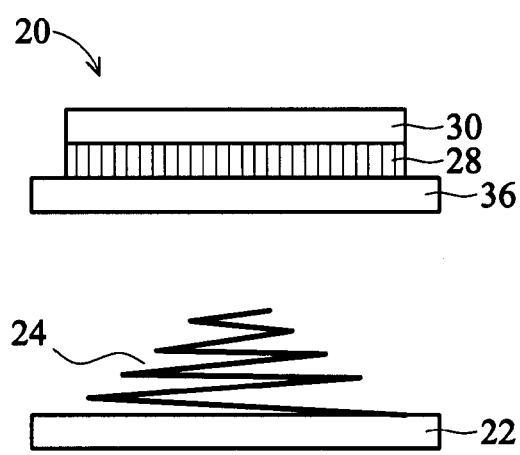
FIG. 3C shows the embodiment of FIG. 3A with the spiral switching member in the reset position.

FIG. 3C illustrates the example embodiment of the non-volatile memory cell 20 shown in FIG. 3A in the reset state. The non-volatile memory cell 20 is reset by passing a current through the spiral-shaped switching member 24. The resistance of the switching member 24 causes self-heating above the Martensite transition temperature (element 4 of FIG. 1). Consequently, the ferromagnetic SMA recovers its initial shape, and so the spiral-shaped switching member 24 breaks the electrical connection to the second electrode 26. The non-volatile memory cell 20 is in a high resistance state.

In a further example embodiment, the second electrode 26 is formed from a ferromagnetic material such as Nickel. The non-volatile memory 20 is set by applying a magnetic field in a similar way to described in the embodiment of FIG. 3A. The magnetic force of attraction between the spiral-shaped switching member 24 and the second electrode 26 retains the switching member 24 in contact with the second electrode 26 once the power to the electromagnet 30 is removed. The non-volatile memory cell 20 is reset by passing a current through the second electrode 26, causing the temperature to rise above the Curie temperature. This reduces the magnetic attraction between the second electrode 26 and the switching member 24 which recovers its original shape due to the elastic restoring force, breaking the electrical connection between the second electrode 26 and the switching member 24.

In an alternative example embodiment, the spiral shaped switching member 24 can be formed from any ferromagnetic material. In this embodiment the non-volatile memory cell is set by applying a magnetic field in a similar way to described in the embodiment of FIG. 3A. The non-volatile memory cell 20 is reset by passing a current through the spiral shaped switching member 24, causing the temperature to rise above the Curie temperature. This reduces the magnetic attraction between the second electrode 26 and the switching member 24 which recovers its initial shape due to the elastic restoring force, breaking the electrical contact between the second electrode 26 and the switching member 24.

Figure 4:
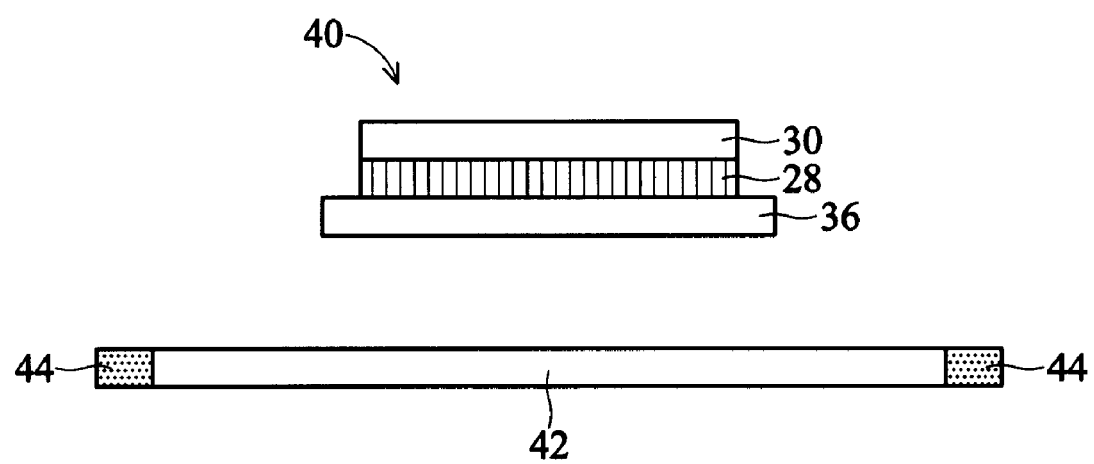
FIG. 4 illustrates a non-volatile memory cell structure comprising a mechanical flexure coated with ferromagnetic material in accordance with a further embodiment.

FIG. 4 illustrates a further example embodiment of the non-volatile memory cell 40. A switching member is formed on a silicon substrate from a mechanical flexure 42 coated with ferromagnetic SMA such as NiMnGa on a silicon substrate. The mechanical flexure 42 is anchored by two anchor points 44 towards each end of the flexure. An electrode 26 is formed above the mechanical flexure 42. The gap between the electrode 26 and the mechanical flexure 42 is either air or an inert atmosphere. An electromagnet 30 is formed above the electrode 26 separated by an insulating layer 28 using conventional evaporation and sputtering techniques.

The non-volatile memory cell 40 is set by applying power to the electromagnet 30. The mechanical flexure 42 is attracted towards the electrode 26. In the set position, the mechanical flexure 42 is held in electrical contact with the electrode 26 by the Van der Waals force between the metals of the electrode 26 and the mechanical flexure 42. Consequently the power can be switched off and the non-volatile memory cell 40 still retains its state.

The non-volatile memory cell 40 is reset by applying a potential difference between the anchor points 44 of the mechanical flexure 42. The current flow in the mechanical flexure 42 causes its temperature to increase above the Martensite transition temperature (element 4 of FIG. 1) and hence the mechanical flexure 42 recovers its initial shape, breaking the electrical connection to the electrode 26. Hence, the non-volatile memory cell 40 is in a high resistance state. This state is stable without applying any further power.

Figure 5A:
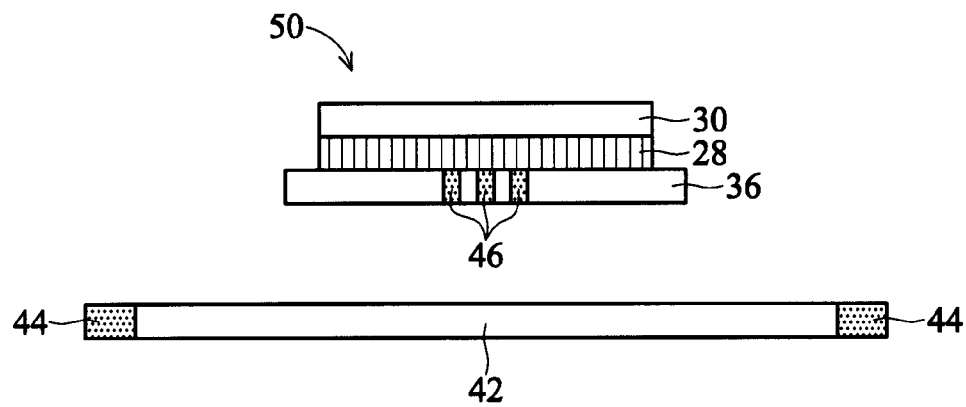
FIGS. 5A and 5B illustrate a non-volatile memory cell structure comprising a mechanical flexure coated with ferromagnetic material and an electrode with stripes of ferromagnetic material in accordance with a further embodiment.
Figure 5B:
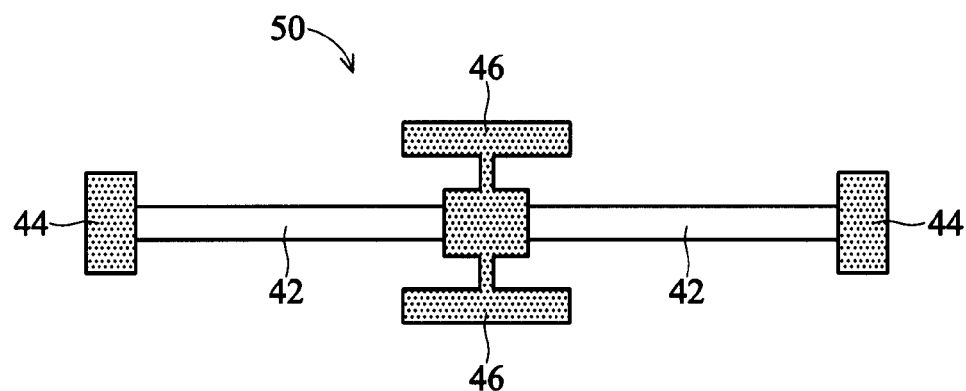

Another example embodiment of the non-volatile memory cell 50 is shown in FIGS. 5A and 5B. A switching member is formed on a silicon substrate from a mechanical flexure 42 coated with ferromagnetic material. The mechanical flexure 42 is anchored by two anchor points 44 towards each end of the flexure. The gap between the electrode 26 and the mechanical flexure 42 is either air or an inert atmosphere. An electrode 26 is formed above the mechanical flexure 42. The electrode includes stripes of a ferromagnetic material such as Nickel 46. The stripes reduce the amount of current required to heat the magnetic material above the Curie temperature. An electromagnet 30 is formed above the electrode 26 separated by an insulating layer 28 using conventional evaporation and sputtering techniques.

The non-volatile memory cell 50 is set by applying power to the electromagnet 30. The mechanical flexure 42 deflected towards the electrode 26 by the magnetic field due to the electromagnet. The mechanical flexure 42 is held in electrical contact with the electrode 26 by the magnetic force of attraction between the metals of the electrode 26 and the mechanical flexure 42. Consequently the power to the electromagnet can be switched off and the non-volatile memory cell 50 still retains its state.

The non-volatile memory cell 50 is reset by passing a current through the electrode 26 which increases the temperature of the electrode 26 above the Curie temperature. This reduces the magnetic attraction between the stripes of magnetic material 46 and the mechanical flexure 42. The elastic restoring force of the mechanical flexure 42 breaks the electrical connection between the magnet and the mechanical flexure 42 recovers its initial shape. Hence in the reset position, the non-volatile memory cell 50 is in a high resistance state, i.e. the resistance of the non-volatile memory cell 50 is higher than when the mechanical flexure 42 is in the set position.

Although particular embodiments have been described, it will be appreciated that many modifications/additions and/or substitutions may be made within the scope of the claims. For example, the switching element can contact the electromagnet 30 so that there does not have to be a separate electrode 26. Embodiments having a ferromagnetic electrode, for retaining the switching member in contact with the electrode in the set position, can be reset by passing a current through either the electrode or the switching member, heating the electrode or switching member respectively above the Curie temperature. Other example embodiments can have a separate heating resistor, which heats either the switching member or the electrode when a current is passed through the heating resistor.

Accordingly, there has been described a non-volatile memory having a magnet (30), a ferromagnetic switching element (24) and heating means (26). The non-volatile memory cell has a set position having a low resistance state and a reset position having a high resistance state. The non-volatile memory is set by applying a magnetic field to the switching element (24) causing it to move to the set position. The non-volatile memory cell is reset by the heating means (26) which causes the switching element (24) to return to the reset position. The switching element can be formed from a ferromagnetic material or a ferromagnetic shape memory alloy.

What is claimed is:

1. A non-volatile memory cell comprising:
   a switching member moveable between a set position and a reset position;
   a magnet for applying a magnetic field to move the switching member to the set position;
   heating means for applying heat, to return the switching member to the reset position.

2. A non-volatile memory cell according to claim 1 further comprising a first contact, wherein the switching member is electrically connected to the first contact in the set position and electrically disconnected to the first contact in the reset position.

3. A non-volatile memory cell according to claim 2, wherein the first contact is magnetic.

4. A non-volatile memory cell according to claim 3, wherein the first contact comprises a plurality of stripes of ferromagnetic material.

5. A non-volatile memory cell according to claim 2, wherein the magnet for applying a magnetic field to move the switching member to the set position is adjacent to the first contact.

6. A non-volatile memory cell according to claim 1, wherein the heating means comprises a current source operable to apply current to the switching member.

7. A non-volatile memory cell according to claim 3, wherein the heating means comprises a current source operable to apply current to the first contact.

8. A non-volatile memory cell according to claim 1, wherein the switching member comprises a ferromagnetic mechanical flexure.

9. A non-volatile memory cell according to claim 1, wherein the switching member comprises a spiral.

10. A non-volatile memory cell according to claim 9 further comprising a second contact electrically connected to the switching member.

11. A non-volatile memory cell according to claim 1, wherein the switching member comprises a shape memory alloy.

12. A non-volatile memory cell according to claim 11, wherein the shape memory alloy comprises a ferromagnetic material.

13. A non-volatile memory cell according to claim 11, wherein the Martensite transformation temperature of the shape memory alloy is in the range of 300 and 350 degrees kelvin.

14. A non-volatile memory cell according to claim 13 wherein the shape memory alloy comprises one of NiMaGa or TiNiCu.

15. A non-volatile memory cell according to claim 1, wherein the magnet for applying a magnetic field to move the switching member to the set position comprises an electromagnet.

16. A non-volatile memory comprising a plurality of memory cells according to claim 1.

* * * * *